US012603109B1

(12) United States Patent
Lapicki et al.

(10) Patent No.: US 12,603,109 B1
(45) Date of Patent: Apr. 14, 2026

(54) P-METAL ELECTRICAL CONTACT OF LASER DIODE FOR HEAT-ASSISTED MAGNETIC RECORDING, AND RELATED APPARATUSES, DATA STORAGE DEVICES, SYSTEMS, AND METHODS

(71) Applicant: Seagate Technology LLC, Fremont, CA (US)

(72) Inventors: Adam Andrzej Lapicki, Londonderry (GB); Reyad Mehfuz, Londonderry (GB)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 19/089,349

(22) Filed: Mar. 25, 2025

(51) Int. Cl.
| | |
|---|---|
| *G11B 7/127* | (2012.01) |
| *G11B 5/02* | (2006.01) |
| *H01S 5/042* | (2006.01) |
| *G11B 5/00* | (2006.01) |

(52) U.S. Cl.
CPC .............. *G11B 7/127* (2013.01); *G11B 5/02* (2013.01); *H01S 5/0421* (2013.01); *G11B 2005/0021* (2013.01)

(58) Field of Classification Search
CPC ...... G09G 3/2003; G09G 3/32; G09G 3/3255; G09G 2300/023; G09G 2300/0426; G09G 2300/04226; G09G 2310/08; H10H 29/14; H10H 25/0753; H10H 20/821; H10H 20/835; H10H 20/857; H10H 33/38; H10H 33/50; H10H 33/46; H10H 33/0025; H10H 33/0062; H10H 27/153; H10H 33/62; H10H 33/405; G11B 7/125; G11B 7/127; G11B 7/1275; G11B 7/128; G11B 2005/0021

USPC .............................................. 360/59; 369/121
See application file for complete search history.

(56) References Cited

U.S. PATENT DOCUMENTS

| | | | |
|---|---|---|---|
| 8,837,261 B1 | 9/2014 | Murata et al. | |
| 9,227,257 B2 | 1/2016 | Hurley et al. | |
| 11,567,834 B2 | 1/2023 | Bent et al. | |
| 2003/0235226 A1* | 12/2003 | Ueki ................... | H01S 5/18394 |
| | | | 372/46.01 |

FOREIGN PATENT DOCUMENTS

WO          2023079311 A1      5/2023

OTHER PUBLICATIONS

Baca et al. "A Survey of Ohmic Contacts to III-V Compound Semiconductors", US Government Report SAND97-0720C, 1997, pp. 1-19.
Biggs et al. "Revised phase diagram for the Pt—Ti system from 30 to 60 at.% platinum", Journal of Alloys and Compounds, vol. 375, 2004, pp. 120-127.

(Continued)

*Primary Examiner* — Nabil Z Hindi
(74) *Attorney, Agent, or Firm* — Mueting Raasch Group

(57) ABSTRACT

Laser diode having a p-metal electrical contact that includes a metal adhesion layer disposed on the p-type region of the semiconductor laser structure, and a metal bi-layer disposed on the metal adhesion layer. The metal bi-layer includes a first metal layer disposed on the metal, adhesion layer, and a second metal layer disposed on the first metal layer. A metal conductive layer is disposed on the second metal layer. Related apparatuses, data storage devices, computing systems, and methods.

20 Claims, 6 Drawing Sheets

(56) References Cited

OTHER PUBLICATIONS

Katz et al. "Pt/Ti ohmic contacts to ultrahigh carbondoped p-GaAs formed by rapid thermal processing", Applied Physics Letters, vol. 56, No. 11, Mar. 12, 1990, pp. 1028-1030.
Luo et al. "Thermodynamic Assessment of the Au—Ti System", Calphad, vol. 25, No. 1, 2001, pp. 19-26.
Moller et al. "The electrochemistry of gold-platinum alloys", Journal of Electroanalytical Chemistry, vol. 570, 2004, pp. 243-255.
Okada et al. "Electrical Characteristics and Reliability of Pt/Ti/PT/Au Ohmic Contacts to p-Type GaAs", Japanese Journal of Applied Physics, vol. 30, 1991, pp. L 558-L 560.

* cited by examiner

P-METAL ELECTRICAL CONTACT OF LASER DIODE FOR HEAT-ASSISTED MAGNETIC RECORDING, AND RELATED APPARATUSES, DATA STORAGE DEVICES, SYSTEMS, AND METHODS

BACKGROUND

The present disclosure relates to laser diodes that can be used in apparatuses such as HAMR read/write heads. There is a continuing need for laser diodes that include one or more diffusion barriers to hinder or prevent diffusion of metal from a p-metal electrical contact into a p-type region of the semiconductor laser structure.

SUMMARY

The present disclosure includes embodiments of a laser diode that includes a semiconductor laser structure having an active region configured to generate laser light; and a p-metal electrical contact disposed on a p-type region of the semiconductor laser structure. The p-metal electrical contact is configured to receive an electrical current to produce optical emission. The p-metal electrical contact includes a metal adhesion layer disposed on the p-type region of the semiconductor laser structure and a metal bi-layer disposed on the metal adhesion layer. The metal bi-layer includes a first metal layer disposed on the metal, adhesion layer, and a second metal layer disposed on the first metal layer. The second metal layer includes a metal that is different from a metal in the first metal layer. The p-metal electrical contact also includes a metal conductive layer disposed on the second metal layer.

The present disclosure includes embodiments of a method that includes forming a multilayer metal structure on a top surface of a p-type region of a semiconductor laser structure, and exposing the multilayer metal structure to thermal annealing conditions to form a p-metal electrical contact. The multilayer metal structure includes a metal adhesion layer disposed on the p-type region of the semiconductor laser structure and a metal bi-layer disposed on the metal adhesion layer. The metal bi-layer includes a first metal layer disposed on the metal, adhesion layer, and a second metal layer disposed on the first metal layer. The second metal layer includes a metal that is different from a metal in the first metal layer. The multilayer metal structure also includes a metal conductive layer disposed on the second metal layer.

BRIEF DESCRIPTION OF THE DRAWINGS

The discussion below references the following figures, wherein the same reference number may be used to identify the similar/same component in multiple figures. The schematic figures are for illustration purposes and are not necessarily drawn to scale.

DETAILED DESCRIPTION

The present disclosure relates to read/write heads used in heat-assisted magnetic recording (HAMR), also referred to as thermally-assisted recording (TAR), thermally-assisted magnetic recording (TAMR), energy-assisted magnetic recording (EAMR), etc. In this disclosure the terms "read/write head," "slider," "recording head," and "head" are used interchangeably. In a HAMR device, a read/write head includes an energy source (e.g., a laser diode) that heats a recording medium during writing. The HAMR read/write head has an optical transmission path that includes a waveguide and near-field transducer, which shape and direct the energy from the energy source to the recording medium.

Laser on Slider (LOS) read/write heads and On-Wafer Laser (OWL) read/write heads use two different approaches for coupling a single-transverse-mode laser diode (also referred to herein as a "laser diode") with read/write heads of hard disk drives, specifically for use in Heat-Assisted Magnetic Recording (HAMR) technology. Both involve the use of laser diodes to heat the magnetic, recording media during the writing process to allow for higher data storage densities. LOS involves directly mounting the laser diode onto the slider of the read/write head, while OWL fabricates the laser diode on a separate (source or donor) substrate (wafer) and transfers it to the slider or target substrate (wafer), before further processing the target substrate to integrate each laser diode into a corresponding read/write head and form individual read/write heads.

Figure 1:
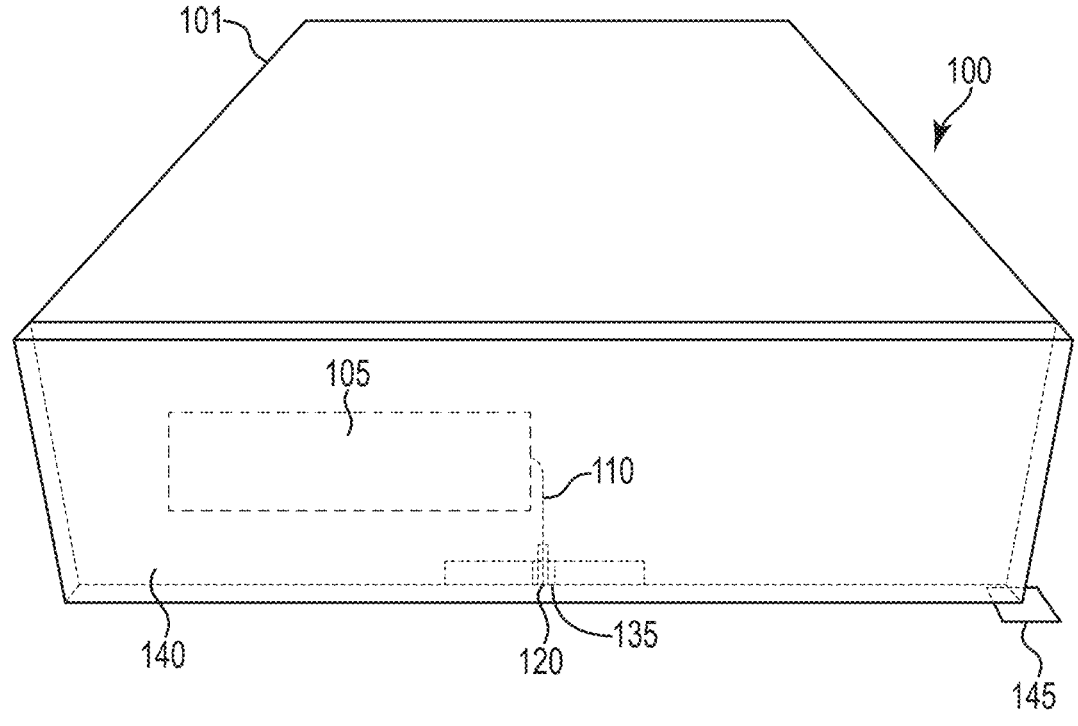
FIG. 1 is a perspective view of a read/write head having an integrated laser diode as an On-Wafer Laser (OWL) in accordance with embodiments described herein.
Figure 1:
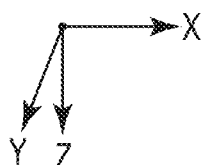

A non-limiting example of an apparatus that includes a laser diode according to the present disclosure is illustrated as apparatus 100 in FIG. 1, which is a heat-assisted magnetic recording read/write head having an On-Wafer Laser (OWL).

As used herein, the direction along x-axis is referred to as the cross-track direction; the direction along the y-axis is referred to as the down-track direction; and the direction along the z-axis is referred to as the media-facing direction. In more detail, the cross-track direction is perpendicular to the tracks on a magnetic recording medium that underlies and rotates relative to a HAMR read/write head. The cross-track direction is aligned with the lateral movement of the HAMR read/write head if it switched from writing (or reading) on one track to another. The down-track direction is parallel to the tracks on the magnetic recording medium and aligned with the rotational motion of the magnetic recording medium. Referring to trailing edge surface 140 in FIG. 1, a magnetic recording medium rotates in a direction from the front of apparatus 100 (which is opposite to the trailing edge surface 140) to the trailing edge surface 140. The media-facing direction points from apparatus 100 (HAMR read/write head) toward the surface of an underlying magnetic recording medium that faces the media-facing surface 145 (also referred to as air-bearing surface (ABS).

Apparatus 100 includes a substrate 101 and a laser diode 105 located on the substrate 101. A near-field transducer 120 (NFT) is located on the substrate 101 and is optically coupled to the laser diode 105 to receive light from the laser diode 105. In the embodiment shown in FIG. 1, a coupler and a waveguide 110 are disposed between the laser diode 105 and the near-field transducer 120 to help communicate light from laser diode 105 to near-field transducer 120.

During operation, the laser diode 105 produces light that is delivered to a region proximate a HAMR read/write transducer 135, which is located near the media-facing surface 145. The media-facing surface 145 faces and is held proximate to the moving surface or recording media (not shown) while reading and writing to the recording media.

The media-facing surface 145 may be configured as an air-bearing surface (ABS) that maintains separation from the media surface via a thin layer of air. The energy is used to heat the recording media as it passes by the read/write transducer 135. Optical coupling components, such as a coupler and waveguide 110, are formed integrally within the substrate 101 (also referred to as slider body), which is near a trailing edge surface 140 as shown, and functions as an optical path that delivers energy from the laser diode 105 to the recording media via the near-field transducer 120. The near-field transducer 120 is located near the read/write transducer 135 and causes heating of the recording media during recording operations. The near-field transducer 120 may be made from plasmonic materials such as gold, silver, copper, etc.

In more detail, laser diodes like laser diode 105 refer to a laser diode that emits light in a well-defined spatial mode so that the laser beam is highly focused and coherent, which facilitates a precise and consistent light source to couple the light to the slider and NFT to heat a recording medium and enable high-density data storage. Such laser diodes are configured to emit light in the fundamental transverse mode (often referred to as the $TE_{00}$ mode), producing a Gaussian beam profile (intensity profile). Also, for HAMR, such laser diodes are configured to have a power output to heat the recording medium without undue losses. In some embodiments, a laser diode for HAMR is configured to have a power output of 200 milliwatts or less, or even 100 milliwatts or less. In some embodiments, a laser diode for HAMR is configured to have a power output from 5 to 100 milliwatts, or even from 10 to 50 milliwatts.

Laser diodes like laser diode 105 include metal electrical contacts for efficiently supplying power, while maintaining thermal and electrical stability, to the laser diode to generate light in the active region that is then directed into the apparatus 100 (HAMR read/write head). Such laser diodes are p-n junction semiconductor lasers that emit light when a forward bias is applied, and include a p-metal electrical contact and n-metal electrical contact. When a voltage is applied across the p-n junction current flows from the p-metal electrical contact through the active region (quantum wells) to the n-metal electrical contact. The p-metal electrical contact and the n-metal electrical contact can each be referred to as an "ohmic contact stack," which, as used herein, refers to a low-resistance electrical connection between a laser diode's semiconductor layers and an external electrical circuit. An ohmic contact stack can provide efficient current injection without significant voltage drops, thereby enabling stable laser operation. The metal electrical contacts include a metal conductive layer (e.g., gold). Unfortunately, the metal conductive layer such as gold in a p-metal electrical contact can diffuse into an underlying semiconductor layer such as, e.g., p-doped GaAs, which can be considered a risk for long-term reliability of a laser diode in a HAMR read/write head. For example, the diffusion of gold may continue over a long period of time and end up in the active region, which can degrade the performance, efficiency, and lifespan of the laser diode. Notably, diffusion of gold from a p-metal electrical contact into an underlying p-doped GaAs layer has been observed using a p-metal electrical contact (p-metal (PMET) stack) having Ti (10 nm)/Au (300 nm)/Pt (10 nm)/Ti(2 nm), where the Ti(2 nm) layer is in contact with a GaAs layer.

According to the present disclosure, an additional metal layer is included in the p-metal electrical contact so that a metal bi-layer is disposed between the metal conductive layer and the metal adhesion layer. For illustration purposes, referring to the p-metal (PMET) stack example above, a Ti layer can be inserted between the Au and Pt layers, and the Pt layer thickness can be increased to form a metal bi-layer. The interaction between the Pt layer and the added Ti layer form desirable diffusion barrier properties while maintaining the overall resistance of the p-metal (PMET) stack at acceptable levels and the overall thickness of the p-metal (PMET) stack within a range acceptable for OWL integration. For example, a p-metal (PMET) stack of Ti (10 nm)/Au (300 nm)/Ti (10 nm)/Pt (50 nm)/Ti(2 nm) was evaluated and it was determined that no detectable diffusion of gold into the GaAs layer was observed while at the same time there was little to no detectable change in the overall resistance of the p-metal (PMET) stack (e.g., less than 0.5 ohms change). While not being bound by theory, it is believed that adding a Ti layer between the Pt and Au layers facilitates formation of Pt—Ti and/or Au—Ti intermetallic compounds at their respective interfaces when exposed to annealing (e.g., rapid-thermal annealing (RTA)) conditions. It is believed that this thermodynamic drive towards formation of intermetallic phases can provide a dynamic diffusion barrier that is effective at relatively low thickness values, providing acceptable electrical resistance properties and overall thickness in the context of integration within an OWL technology, as compared to a thicker Pt layer alone.

Figure 2:
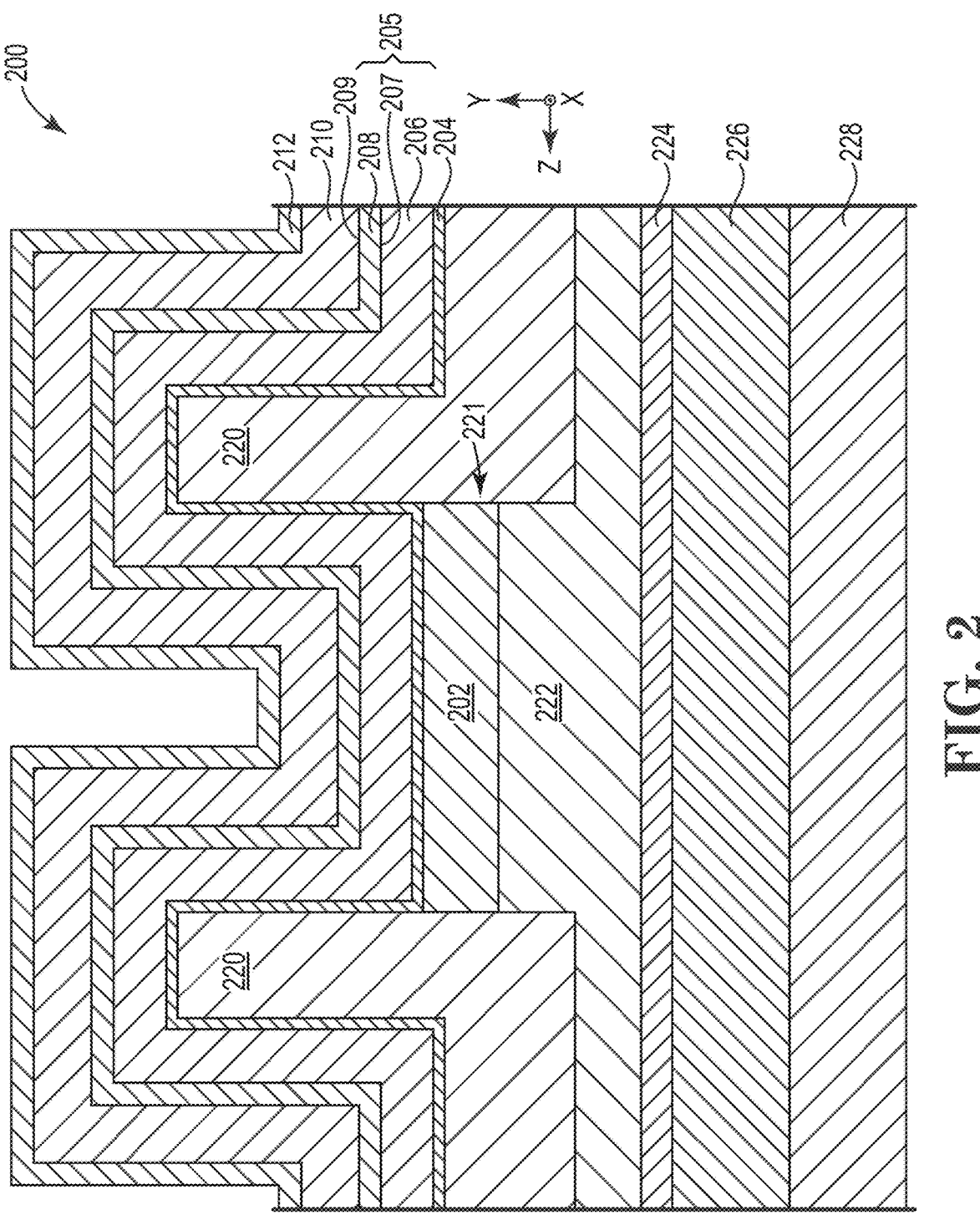
FIG. 2 is a partial, schematic cross-sectional view, of an embodiment of a laser diode with a p-metal electrical contact according to the present disclosure.

A non-limiting example of a laser diode having p-metal electrical contact according to the present disclosure will be illustrated concerning FIG. 2. It is noted that the thickness of layers referred to in FIG. 2 refers to the distance of the layer in the y-direction.

Referring to FIG. 2, a laser diode 200 is a semiconductor laser structure having an active region 224 configured to generate laser light. As discussed with respect to FIGS. 3-7 below, the semiconductor structure includes one or more non-self-supporting layers of crystalline material, (e.g., not a separately packaged device) but is physically transferred to a target read/write head substrate that does contain already or will contain, after further processing, the other components of the read/write head (e.g., write coil and poles, reader stack) without the use of a separate or intermediate support during attachment.

As mentioned, a laser diode also includes a p-metal electrical contact disposed on a p-type region of the semiconductor laser structure. The p-metal electrical contact is configured to receive an electrical current to produce optical emission. Referring to FIG. 2, the p-metal contact includes at least metal adhesion layer 204, metal bi-layer 205 (metal layer 206 and metal layer 208), and metal conductive layer 210. Optionally, as shown in FIG. 2, a p-metal contact can also include at least metal layer 212.

Metal adhesion layer 204 is disposed on the p-type region 221 of the semiconductor laser structure of laser diode 200. As shown in FIG. 2, metal adhesion layer 204 is disposed on and in contact with p-type semiconductor layer 202. As the name suggests, the metal adhesion layer 204 improves adhesion between the p-metal electrical contact and the surface of p-type semiconductor layer 202 to help form a stable interface between the p-type semiconductor layer 202 and the rest of the p-metal electrical contact. In addition to adhesion properties just mentioned, a metal can be selected for metal adhesion layer 204 based on its electrical resistance and/or diffusion barrier properties. Non-limiting examples of metal material for metal adhesion layer 204 includes titanium (Ti), chromium (Cr), nickel (Ni), tantalum (Ta), and combinations thereof. The thickness of the metal adhesion layer 204 can be selected to provide desirable adhesion while not impacting electrical contact resistance at the interface between metal adhesion layer 204 and p-type semiconductor layer 202 to an undue degree. In some embodiments, the metal adhesion layer 204 has a thickness from 0.1 nanometers to 10 nanometers, from 0.5 nanometers to 8 nanometers, or even from 0.5 nanometers to 5 nanometers.

Various deposition techniques may be used to deposit metal layer 204. Non-limiting examples of illustrative deposition methods include vapor deposition techniques such as chemical vapor deposition (CVD), physical vapor deposition (PVD), including magnetron sputtering, cathodic arc deposition, plasma enhanced chemical vapor deposition (PECVD) and laser ablation. In some examples, deposition techniques that are conformal in nature may be used. Illustrative conformal techniques may include, for example, atomic layer deposition (ALD), chemical vapor deposition (CVD), ion beam deposition (IBD) and others.

As mentioned above, according to the present disclosure, an additional metal layer is included in the p-metal electrical contact so that a metal bi-layer is present between the metal conductive layer and the metal adhesion layer. Referring to FIG. 2, metal bi-layer 205 is disposed between the metal conductive layer 210 and the metal adhesion layer 204. Metal bi-layer 205 includes metal layer 206 and metal layer 208.

Metal layer 206 is disposed on the metal adhesion layer 204. While metal layer 206 is electrically conductive and can be selected to have relatively low electrical resistance, it can also function as a barrier, at least in part, to diffusion of metal from metal conductive layer 210 into the p-type region 221, such as the p-type semiconductor layer 202. Non-limiting examples of a metal for metal layer 206 includes platinum (Pt), palladium (Pd), and combinations thereof. In some embodiments, the metal layer 206 has a thickness from 10 nanometers to 150 nanometers, from 10 nanometers to 100 nanometers, or even from 20 nanometers to 100 nanometers.

Various deposition techniques may be used to deposit metal layer 206. Non-limiting examples of illustrative deposition methods include vapor deposition techniques such as chemical vapor deposition (CVD), physical vapor deposition (PVD), including magnetron sputtering, cathodic arc deposition, plasma enhanced chemical vapor deposition (PECVD) and laser ablation. In some examples, deposition techniques that are conformal in nature may be used. Illustrative conformal techniques may include, for example, atomic layer deposition (ALD), chemical vapor deposition (CVD), ion beam deposition (IBD) and others.

Metal layer 208 is disposed on the metal layer 206 and is present as part of metal bi-layer 205. As used herein, a "metal bi-layer" includes two metal layers deposited on top of each other. As discussed below, intermetallic compounds can be formed at the interface of these two metal layers, where the intermetallic compounds can have one or more improved properties as compared to one or both metal layers of a metal bi-layer. Thus, metal layer 206 includes a metal that is different from a metal in metal layer 208. As discussed below, a p-metal contact is exposed to thermal annealing conditions. During thermal annealing, one or more intermetallic compounds are formed at the interface 207 between metal layer 206 and metal layer 208. In some embodiments, if the thermal annealing is relatively short (e.g., rapid-thermal annealing), then the intermetallic compounds may not form a uniform layer in the z-direction. But, the intermetallic compounds can still be present in a manner such that they enhance the diffusion barrier properties of the metal bi-layer 205 between metal conductive layer 210 and the p-type region 221 while providing acceptable electrical resistance properties and overall thickness in the context of integration within OWL technology. While metal layer 208 is electrically conductive and can be selected to have a thickness that has relatively low electrical resistance, it can also function as a diffusion barrier, at least in part, between metal conductive layer 210 and the p-type region 221. A non-limiting example of metal material for metal layer 208 includes titanium, zirconium, hafnium, chromium, vanadium, and combinations thereof. In some embodiments, the metal layer 208 has a thickness from 5 nanometers to 50 nanometers, or even from 5 nanometers to 30 nanometers.

It is noted that, similar to interface 207 discussed in the previous paragraph, during thermal annealing, one or more intermetallic compounds can also be formed at the interface between metal adhesion layer 204 and metal layer 206, which can help form a diffusion barrier, at least in part, between metal conductive layer 210 and the p-type region 221.

Various deposition techniques may be used to deposit metal layer 208. Non-limiting examples of illustrative deposition methods include vapor deposition techniques such as chemical vapor deposition (CVD), physical vapor deposition (PVD), including magnetron sputtering, cathodic arc deposition, plasma enhanced chemical vapor deposition (PECVD) and laser ablation. In some examples, deposition techniques that are conformal in nature may be used. Illustrative conformal techniques may include, for example, atomic layer deposition (ALD), chemical vapor deposition (CVD), ion beam deposition (IBD) and others.

Metal conductive layer 210 is disposed on metal layer 208. Metal conductive layer 210 can be considered a primary ohmic layer of a p-metal electrical contact in that helps provide relatively low contact resistance for efficient hole injection. Non-limiting examples of metal material for metal conductive layer 210 include gold (Au), copper (Cu), and combinations thereof. In some embodiments, the metal conductive layer 210 has a thickness from 100 nanometers to 800 nanometers, from 100 nanometers to 600 nanometers, or even from 200 nanometers to 400 nanometers.

In some embodiments, during thermal annealing, one or more intermetallic compounds may also be formed at the interface 209 between metal layer 208 and metal conductive layer 210. In some embodiments, if the thermal annealing is relatively short (e.g., rapid-thermal annealing), then the intermetallic compounds may not form a uniform layer in the z-direction. But, the intermetallic compounds can still be present in manner such that they also form a diffusion barrier, at least in part, between metal conductive layer 210 and the p-type region 221 while providing acceptable electrical resistance properties and overall thickness in the context of integration within OWL technology.

Various deposition techniques may be used to deposit metal conductive layer 210. Non-limiting examples of illustrative deposition methods include vapor deposition techniques such as chemical vapor deposition (CVD), physical vapor deposition (PVD), including magnetron sputtering, cathodic arc deposition, plasma enhanced chemical vapor deposition (PECVD) and laser ablation.

Optionally, a p-metal electrical contact can include one or more metal layers disposed over the metal conductive layer 210. For example, referring to FIG. 2, metal layer 212 is disposed on metal conductive layer 210. In some embodiments, metal layer 212 can be referred to as a corrosion-inhibiting layer. A corrosion-inhibiting layer may be formed from a corrosion-inhibiting material or an element that exhibits an electrochemical potential that is more negative (i.e., less than) than the electrochemical potential of the elements in p-type semiconductor layer 202. Although not wishing to be bound by theory, it is believed that when multilayer ohmic contact material formed on a semiconductor material is immersed in a corrosive solution during fabrication of the laser diode, the multilayer ohmic contact material behaves like a cathode, and the semiconductor material behaves like an anode. This may cause anodic oxidation of the semiconductor material which may result in corrosion of the semiconductor material. It is believed that by incorporating a material of a more negative electrochemical potential than the electrochemical potential of the elements in the semiconductor material, cathodic protection may occur. Cathodic protection may divert the anodic oxidation (an electrochemical reaction) from the semiconductor material to the corrosion-inhibiting material. Examples of corrosion-inhibiting materials include Ti, Cr, Zn, Zr, Fe, Mn, Zn, Al. Mg, and combinations thereof. In some embodiments, metal layer 212 has a thickness of 5 nanometers or greater (e.g., from 5 to 50 nanometers).

Various deposition techniques may be used to deposit metal layer 212. Non-limiting examples of illustrative deposition methods include vapor deposition techniques such as chemical vapor deposition (CVD), physical vapor deposition (PVD), including magnetron sputtering, cathodic arc deposition, plasma enhanced chemical vapor deposition (PECVD) and laser ablation. In some examples, deposition techniques that are conformal in nature may be used. Illustrative conformal techniques may include, for example, atomic layer deposition (ALD), chemical vapor deposition (CVD), ion beam deposition (IBD) and others.

In some embodiments, the layers in a p-metal electrical contact are deposited while under a vacuum to avoid undue oxidation, which can degrade the conductive property of the p-metal electrical contact.

As mentioned above, laser diode 200 also includes active region 224. The active region 224, or gain medium, is where light generation occurs through the process of stimulated emission. The active region of a laser diode is formed by a process known as epitaxial growth, where layers of semiconductor materials are deposited onto a substrate (e.g., substrate 300 discussed below) via molecular beam epitaxy (MBE) or metal-organic chemical vapor deposition (MOCVD). These layers form a p-n junction that constitutes the active region.

The active region of a laser diode is made from semiconductor materials, often from the III-V groups of the periodic table. These materials are selected for their ability to efficiently support electron-hole recombination, which generates photons (light) through the process of stimulated emission. The materials selected for the active region can depend on the desired wavelength of the laser and the specific application. For example, laser diodes for HAMR read/write heads are configured to operate in the near-infrared region from 800 nm to 1000 nm. Non-limiting examples of materials used to form the active region include gallium arsenide (GaAs) and alloys thereof (e.g., indium gallium arsenide (InGaAs) and aluminum gallium arsenide (AlGaAs)); indium phosphide (InP) and alloys thereof (e.g., indium gallium arsenide phosphide (InGaAsP)); gallium nitride (GaN) and alloys thereof (e.g., indium gallium nitride (InGaN) and indium gallium nitride (InGaN)); aluminum gallium indium phosphide (AlGaInP); and zinc selenide (ZnSe).

During manufacture of the p-metal electrical contact, the p-metal electrical contact layers discussed above are deposited to form a multilayer metal structure. After deposition, the multilayer metal structure can be exposed to thermal annealing conditions to form the corresponding p-metal electrical contact. Thermal annealing conditions can be selected based on the compositions of the multilayer metal structure and the semiconductor materials such as p-type semiconductor layer 202. Exposing the multilayer metal structure to thermal annealing conditions can help adhesion at the interface between the surface of metal adhesion layer 204 in contact with the surface of p-type semiconductor layer 202. Exposing the multilayer metal structure to thermal annealing conditions can also help form intermetallic compounds at the interface 207 and the interface 209, as discussed above.

Non-limiting examples of thermal annealing conditions include exposing a wafer (e.g., substrate 300 discussed below) that includes the multilayer metal structure to a forming gas (e.g., $N_2$ and $H_2$) and/or vacuum to avoid undue oxidation while exposing the wafer to a temperature (annealing temperature) in a range from 200° C. to 500° C., or even from 350° C. to 450° C., for a time period from 5 seconds to 30 minutes, from 5 seconds to 5 minutes, or even from 5 to 90 seconds. In some embodiments, a temperature ramp-up protocol can be used to avoid undue thermal stress. After being exposed to the "annealing temperature" for a specified time, a relatively slow cool down can be performed, if desired, to avoid undue thermal stress and/or cracking.

To help provide a controlled environment for thermal annealing, the wafer structure stack 252 can be loaded or positioned in a furnace, rapid thermal annealer (RTA), or other suitable equipment.

Turning to the remaining layers in laser diode 200, the active region 224 is surrounded by other materials that serve optical and electrical functions, such as guiding light and injecting charge carriers. Cladding layers surround the active region and have a lower refractive index than the active region to create total internal reflection and confine light to propagate within the active region. Layers of cladding can be placed above and below the active region to confine the light within the active region 224. The selection of materials and formation techniques can depend on the specifications of the laser and the requirements for integration within a read/write head.

Cladding layers in read/write heads can be grown around the active region using epitaxial growth methods, such as molecular beam epitaxy (MBE), or deposited through processes like sputtering or chemical vapor deposition (CVD) (e.g., metal-organic chemical vapor deposition (MOCVD)). Non-limiting examples of materials for cladding layers include aluminum gallium arsenide (AlGaAs), gallium arsenide (GaAs), indium phosphide (InP), silicon dioxide ($SiO_2$), aluminum oxide ($Al_2O_3$), and combinations thereof.

The cladding layers of a laser diode often include "p-type" (or "p-doped") and "n-type" (or "n-doped") layers in the laser diode. The p-type and n-type cladding layers are electrically active, forming part of the laser diode's structure to facilitate electron-hole recombination in the active region. N-doping and p-doping are methods used to modify the electrical properties of semiconductor materials by introducing impurities to form n-type cladding layers and p-type cladding layers, respectively. The impurities, known as "dopants," increase the concentration of free charge carriers, thereby enhancing the conductivity of the semiconductor material. N-doping introduces atoms with more valence electrons than the semiconductor material that is being doped. The "extra" electrons can move freely, contributing to electrical conductivity. Non-limiting examples of n-dopants include silicon, tellurium, sulfur, selenium, combinations of these, and the like.

The n-type cladding layers are located "below" the active region, and the p-type cladding layers are located "above" the active region. Referring to FIG. 2, active region 224 is surrounded by n-type cladding layer 226 and p-type cladding layer 222.

A laser diode can also include at least one contact layer. A contact layer refers to a doped layer that is located between a cladding layer and an electrode contact to enhance electrical contact. Referring to FIG. 2, laser diode 200 includes p-type semiconductor layer 202 as a p-type contact layer located between and in contact with p-type cladding layer 222 and metal adhesion layer 204. Non-limiting examples of materials for p-type semiconductor layer 202 include aluminum gallium arsenide (AlGaAs), gallium arsenide (GaAs), indium gallium phosphide (InGaP), and combinations thereof. A p-type contact layer can be formed doping with one or more impurities such as zinc, magnesium, beryllium, carbon, tellurium, and combinations thereof.

A laser diode also include at least one n-type substrate, which refers to a foundational layer upon which the rest of the laser diode structure is built. The n-type substrate provides structural stability and serves as the base for the epitaxial growth of subsequent layers (active region, cladding, etc.). The n-type substrate also facilitates good electrical conduction to the n-side electrode, enabling current flow through the laser diode like p-type semiconductor layer 202 discussed above. An n-type substrate can also help dissipate heat efficiently to help reduce the risk of overheating and improve the longevity of the laser diode. Non-limiting examples of material used to make an n-type substrate include gallium arsenide (AlGaAs), gallium arsenide (GaAs), indium phosphide (InP), and combinations thereof. A substrate can be doped to form an n-type substrate using impurities such as silicon, tellurium, and the like, for electrical conductivity. An n-side substrate can be a bulk crystal material that is sliced from a large, high-purity, single-crystal ingot and polished to serve as a base material. The lattice structure of the n-type substrate ensures proper alignment and growth of subsequent epitaxial-grown layers. Referring to FIG. 2, laser diode 200 can include an n-type substrate 228.

As mentioned above, a laser diode 200 also includes an n-metal electrical contact (not shown). In some embodiments, the n-metal electrical contact can be located on the top surface of a "ledge" or "patio" of the n-type substrate 228. The n-metal electrical contact provides a pathway for current flow and form an electrical connection with the n-type cladding layer 226.

In some embodiments, a laser diode can include one or more passivation layers. Referring to FIG. 2, laser diode 200 includes passivation layers 220 (electrically-insulating layers). A passivation layers 220 can, e.g., reduce current heating effects at etched surfaces. Passivation layers 220 can be formed using semiconductor processing steps, for example, photoresist processes, deposition processes (e.g., vacuum deposition, sputtering, atomic layer deposition), and etch processes (e.g., reactive ion etch). Passivation layers 220 may include $SiO_2$, $Si_3N_4$, $Y_2O_3$, Si, $TiO_2$, $Al_2O_3$, or combinations thereof. In some embodiments, passivation layers have a thickness ranging from about 200 to about 300 nm.

Laser diode 200 can be configured to be integrated into the apparatus to direct light from the light-exit fact of the laser diode to a waveguide in the apparatus. For example, as shown in FIG. 1 and discussed above, a laser diode can be coupled to or integrated into an apparatus 100 such as a HAMR read/write head. As can be seen, laser diode 105 is encapsulated on the substrate 101. Substrate 101 includes encapsulation material such as dielectric material, which encapsulates the laser diode 105. Non limiting examples of dielectric material for substrate 101 include silicon dioxide, silicon nitride, aluminum oxide, and combinations thereof.

An example of fabricating HAMR read/write heads with on-wafer lasers having a p-metal electrical contact according to the present disclosure is illustrated in FIGS. 3 to 7.

Figures 3, 4, 5, 6, 7:
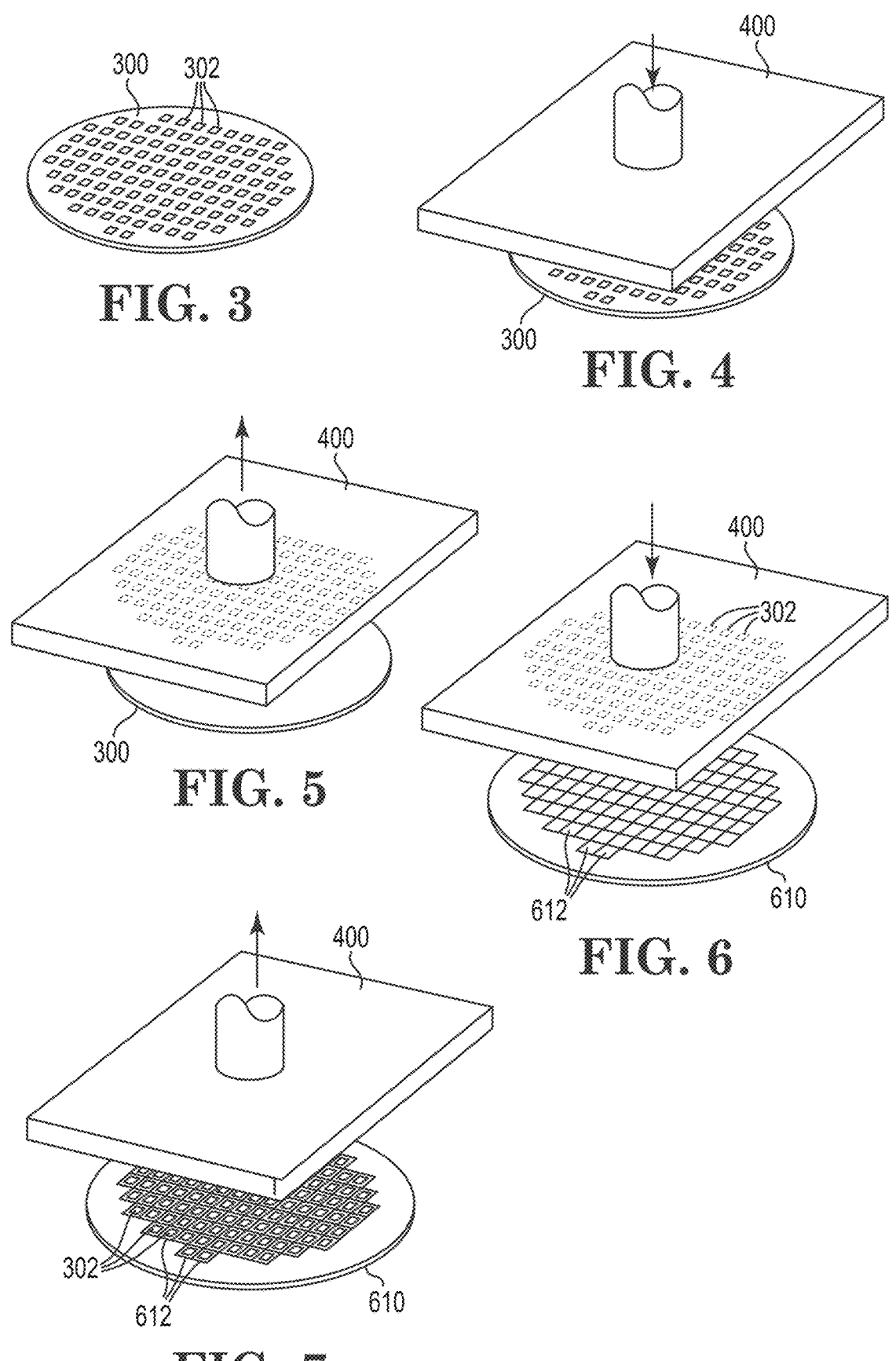
FIG. 3 is a perspective drawing showing a source substrate with a plurality of laser diodes.
FIG. 4 is a perspective drawing showing the transfer print head moving to "pick" the plurality of laser diodes from the source substrate shown in FIG. 3.
FIG. 5 is a perspective drawing showing the transfer print head of FIG. 4 lifting the "picked" plurality of laser diodes.
FIG. 6 is a perspective drawing showing the transfer print head moving to "print" the "picked" plurality of laser diodes from FIG. 5 to a source substrate.
FIG. 7 is a perspective drawing showing the transfer print head of FIG. 6 moving away from the "printed" plurality of laser diodes.

In FIG. 3, a donor or source substrate 300 is shown as a wafer that includes a plurality of laser diodes 302, such as laser diode 200, that were formed/fabricated on the substrate 300 via, e.g., epitaxial growth, photolithography, etching, deposition, and the like. If desired, a sacrificial (release) layer may be included between the laser diodes 302 and the substrate 300 to allow separation.

As shown in FIG. 4, a transfer print head 400 is lowered to contact the laser diodes 302 with sufficient pressure to temporarily "grip" the laser diodes via a handling layer (e.g., a soft material like polydimethylsiloxane, PDMS) to gently pick up the released laser diodes from the source substrate 300 or wafer without damaging them.

The transfer print head 400 is lifted as shown in FIG. 5, taking the laser diodes 302 with it. In this way, the laser diodes 302 are then transferred to a mounting surface on target substrate 610 as shown in FIGS. 6 and 7 via transfer printing.

As seen in FIG. 6, the transfer print head 400 is lowered over a target substrate 610 or wafer that includes a number of partially-processed, read/write heads 612. The transfer print head 400 presses the laser diodes 302 on to the target substrate 610 and is then moved away as seen in FIG. 7 to transfer each of the laser diodes 302 to a corresponding read/write head. Afterwards, the substrate 610 is further processed, e.g., depositing additional layers of material to form the remaining read/write head components. A non-limiting example of further processing includes encapsulating each laser diode on each read/write head to integrate each laser diode into each read/write head, followed by dicing individual read/write heads to separate them from the target substrate 610.

Figure 8A:
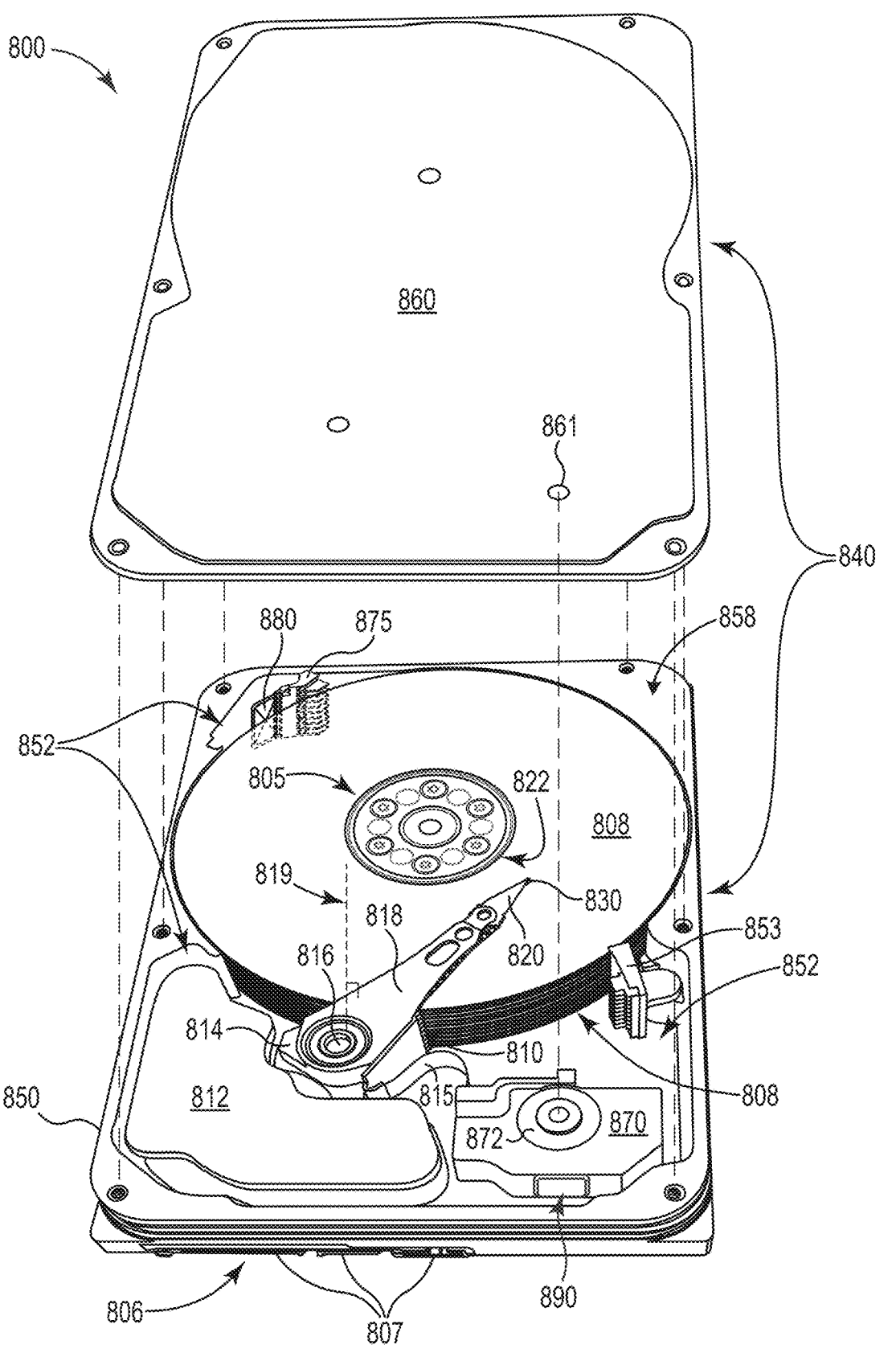
FIG. 8A is an exploded, perspective view of an example of a hard-disk drive that may include a read/write head having a laser diode with a p-metal electrical contact according to the present disclosure.
Figure 8B:
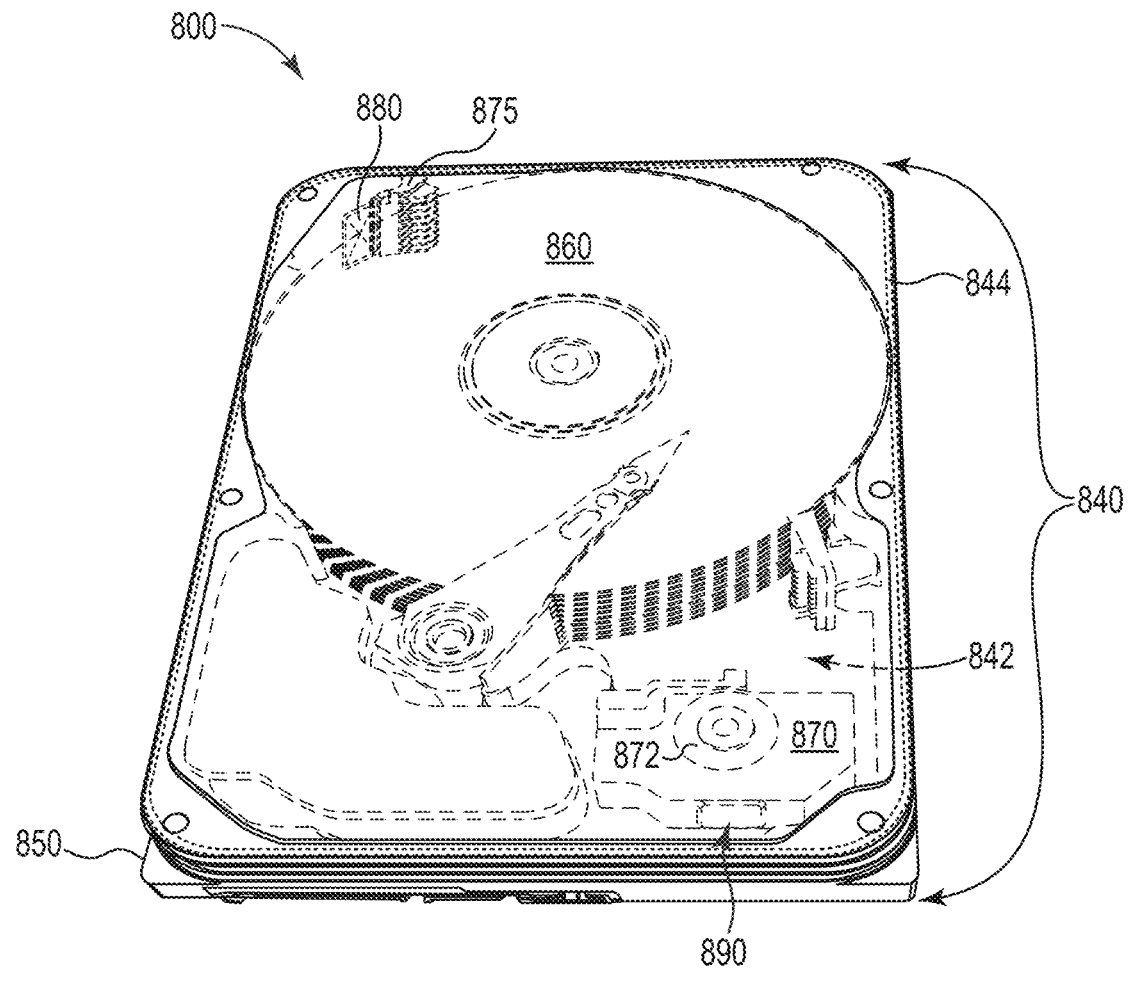
FIG. 8B is a perspective view of the hard-disk drive shown in FIG. 8A in its assembled configuration and showing interior components in broken lines.

An apparatus that includes a laser diode with a p-metal electrical contact according to the present disclosure can be used in a data storage device such as a hard disk drive. A non-limiting example of a hard disk drive that can include one or more read/write heads having a laser diode with a p-metal electrical contact according to the present disclosure is illustrated in FIGS. 8A and 8B. Advantageously, such a hard disk drive can operate with reduced laser diode failure in the read/write head, and therefore may be commercially superior.

Data storage device 800 is illustrated as a hard-disk drive (HDD) that includes an outer enclosure or housing 840 configured to contain multiple hard-disk drive components, including electronic components. Housing 840 includes a base 850 and a cover 860 mounted to the base 850. Base 850 includes a recess or cavity 852 configured to accommodate components of data storage device 800. Base 850 can also be referred to as a motor base assembly (MBA). Data storage device 800 further includes a printed circuit board assembly (PCBA) 806. PCBA 806 of this configuration is coupled to base 850 and includes a plurality of input/output connectors 807 that are each configured to provide an interface between one or more components of data storage device 800 and one or more host devices (e.g., a computer, a server, a consumer electronic device, or the like).

Base 850 and cover 860 may be formed from any suitable material, such as metal (e.g., aluminum), plastic, or other suitable material or combinations thereof. In some embodiments, base 850 includes multiple components, such as an outer frame and a bottom cover, that are coupled together (e.g., by screws, welding, or the like).

Cover 860 is configured to couple to base 850 to enclose components of data storage device 800, as shown in FIG. 8B. As shown, cover 860 is aligned with and coupled to a surface of base 850, such as a surface 858 shown in FIG. 8A, to define an interior volume 842 of data storage device 800, which includes an interior gas space. A load/unload ramp 853 is also positioned in interior volume 842. Components other than those illustrated or specifically identified in FIGS. 8A and 8B and described herein are contemplated as being positioned within the interior volume 842, such as a preamp and/or assembly hardware, for example. Cover 860 can be coupled to the base 850 using any suitable technique, such as using one or more screws, connection fingers, locking/clipping structures, adhesives, rivets, other mechanical fasteners, welding (e.g., ultrasonic welding) or combinations thereof. In some embodiments, data storage device 800 can further include one or more seals disposed between base 850 and top cover 860 and configured to seal the interior volume 842 of data storage device 800. In some embodiments, seal 844 can be a weld formed between base 850 and cover 860, or seal 844 can be a form-in-place gasket (FIPG).

A gas or gas mixture may be added to interior volume 842 of data storage device 800. Helium, for example, may be included in interior volume 842 to reduce mechanical vibrations, particularly of head gimbal assemblies (HGAs) of data storage device 800. Helium may also be included within data storage device 800 to enable lower head-media spacing (HMS) between a reader and/or writer of a magnetic recording head and a magnetic disk, and thus a higher areal density capability (ADC) of data storage device 800. The interior gas space of the interior volume 842 may benefit from a small amount of oxygen. In some embodiments, interior gas space can have an oxygen concentration in the range from 0.1 to less than 20 mole percent, from 0.1 to 15 mole percent, or even from 3 to 15 mole percent based on the total gas in the interior gas space, with the balance being helium.

In some embodiments, data storage device 800 can be a sealed (hermetically sealed) data storage device, which can be defined by, e.g., the amount of gas (e.g., helium) that leaks from the data storage device after it has been sealed (e.g., a welded HDD). In some embodiments, a hermetically sealed data storage device having its interior gas space filled with helium gas has a nominal helium leak rate of less than 10% by volume in five years. In some embodiments, in terms of (atm cc/second), a hermetically sealed data storage device having its interior gas space filled with helium gas has a nominal helium leak rate of $10\times10^{-8}$ atm (atmosphere) cc (cubic centimeter)/second or less at 25° C.; $8\times10^{-8}$ atm cc/second or less, $5\times10^{-8}$ atm cc/second or less; or even $4\times10^{-8}$ atm cc/second or less at 25° C. As mentioned above, a form-in-place gasket can be used to help seal a data storage device.

Data storage device 800 includes an actuator 810, which includes a head stack assembly (HSA) 814 and voice coil motor 812. Head-stack assembly 814 is rotatably mounted to the base 850, and includes radially-extending arms 818 that are rotatable about an axis 819 that is perpendicular to the floor of base 850 as shown in FIG. 8A. Data storage device 800 includes one or more magnetic disks configured to store bits of data. HSA 814 further includes a plurality of head-gimbal assemblies (HGAs). Each HGA 820 includes a read/write head 830 for reading data from and writing data to a surface of a magnetic disk 808. HSA 814 can include one or more subcomponents. Non-limiting examples of such subcomponents include hookup 815 (a flex cable and a flex clamp) and/or adhesives. Other components of a read/write head 830 can be included, such as heaters, heat sinks, and piezoelectric actuators, for example.

Voice coil motor 812 produces a magnetic field that exerts a force on HSA 814, causing radially-extending arms to rotate about a shaft 816 in either rotational direction. Each radially-extending arm 818 is mechanically and rotatably coupled to shaft 816 such that as HSA 814 rotates it causes each radially-extending arm 818, and thus magnetic recording heads, to move relative to magnetic disks 808. Voice coil motor 812 includes magnets and a voice coil.

Data storage device 800 further includes a motor assembly 805 configured to rotatably support magnetic disks and circumferentially rotate magnetic disks about an axis of rotation during operation. Magnetic disks are mounted on motor assembly 805 such that an annular volume of each magnetic disk 808 encircles a portion of motor assembly 805. Further, magnetic disks are separated from each other in a stacked manner using spacers (not shown). Motor assembly 805 has an outside diameter 822 and may rotate magnetic disks during an operation of data storage device 800 such that each magnetic disk 808 moves relative to a respective read/write head 830 to enable the read/write heads to read data from and/or write data to the magnetic disk 808.

Data storage device 800 includes a diverter 875 that is proximal to magnetic disks 808. Diverter 875 is configured to divert helium and/or other interior gas mixtures(s) to reduce windage on each radially-extending arm 818, which can reduce undesired vibrations that may cause a read/write head 830 to move off track and/or contact a magnetic disk 808.

The data storage device 800 includes components having an adsorbent composition in the form an article that permits the components to be positioned and/or mounted in the interior volume 842 of data storage device 800 so that the adsorbent composition can adsorb moisture and/or organic vapors from the interior gas. In some embodiments, a component can also include filtering capability to remove organic particulate material. As shown in FIGS. 8A and 8B, non-limiting examples of such components include an environmental control module 870, a recirculation filter 880, and a label filter 890 for such a purpose. As shown, environmental control module 870 includes an inlet diffuser seal 872 helps its contents (e.g., environmental control module tablet (not shown)) dry during manufacturing. The environmental control module tablet can become exposed to the interior volume 842 of data storage device 800 by breaking the seal located at the bottom center of inlet diffuser seal 872 to create an opening (not shown) so that gas exchange can occur between the inside of environmental control module 870 and the interior volume 842.

Figure 9:
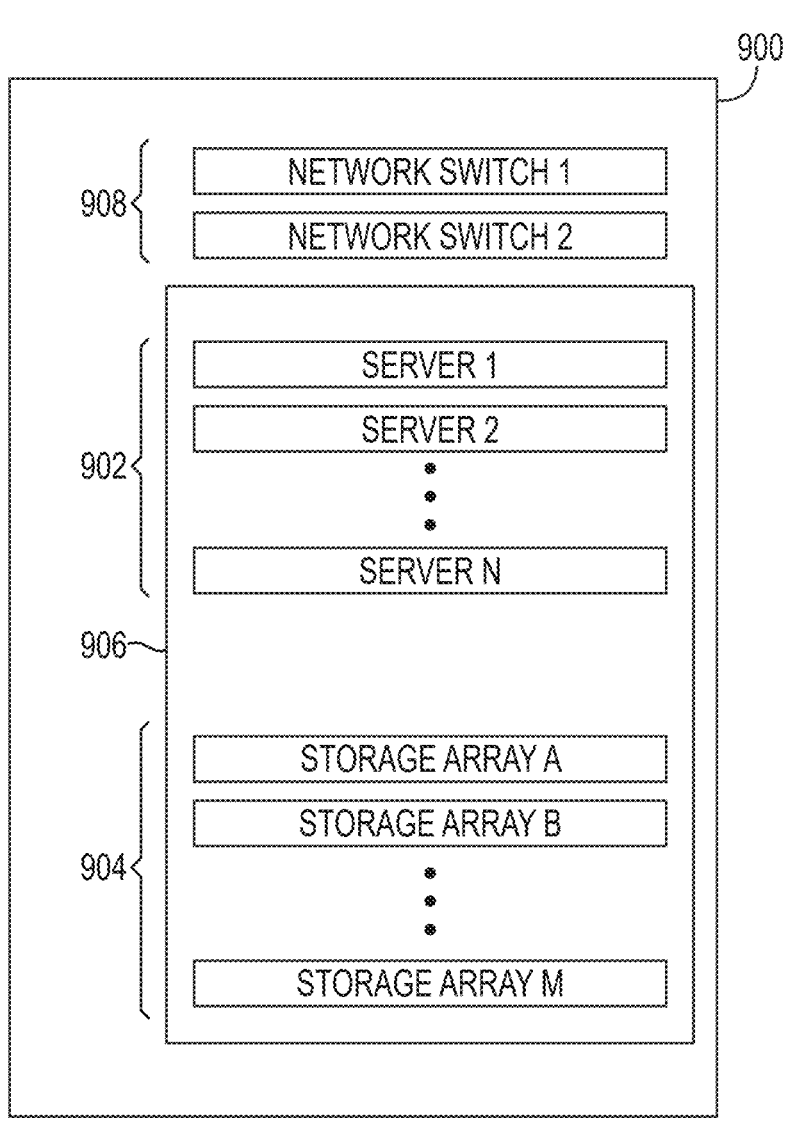
FIG. 9 is a block diagram of a data center system including a plurality of data storage devices that may each include one or more read/write heads having a laser diode with a p-metal electrical contact according to the present disclosure.

FIG. 9 illustrates a non-limiting example of a computing system 900 that includes a plurality of data storge devices (e.g., data storage device 800) that may each include one or more read/write heads having a laser diode with a p-metal electrical contact according to the present disclosure. In FIG. 9, a diagram shows a computing system 900 that can have a computing enclosure used in network storage services. As shown, the computing enclosure includes a plurality of servers 902 coupled to a plurality of drive arrays 904 via a rack-level network fabric 906. Each server 902 can include at least one CPU coupled to random access memory (RAM) and an input/output (IO) subsystem. Each server 902 may have one or more dedicated power supplies (not shown) or the enclosure may provide power through a power bus (not shown). Each server 902 may also have an IO interface for connecting to the rack-level network fabric 906. The rack-level network fabric 906 may use other rack-level networking technology such as switches 908.

The drive arrays 904 may each include a separate sub-enclosure with IO busses, power supplies, storage controllers, etc. The drive arrays 904 include a plurality of individual data storage devices (e.g., HDD) densely packed into the sub-enclosure. An example of a data center that includes a computing system have a plurality of data storage devices is also described in U.S. Pat. No. 11,567,834 (Bent et al.).

What is claimed is:

1. A laser diode comprising:
a semiconductor laser structure having an active region configured to generate laser light; and
a p-metal electrical contact disposed on a p-type region of the semiconductor laser structure, wherein the p-metal electrical contact is configured to receive an electrical current to produce optical emission, and wherein the p-metal electrical contact comprises:
  a metal adhesion layer disposed on the p-type region of the semiconductor laser structure;
  a metal bi-layer disposed on the metal adhesion layer, wherein the metal bi-layer comprises:
    a first metal layer disposed on the metal adhesion layer, and
    a second metal layer disposed on the first metal layer, wherein the second metal layer comprises a metal that is different from a metal in the first metal layer; and
  a metal conductive layer disposed on the second metal layer.

2. The laser diode of claim 1, wherein the second metal layer comprises a metal chosen from titanium, zirconium, hafnium, chromium, vanadium, and combinations thereof.

3. The laser diode of claim 1, wherein the second metal layer has a thickness from 5 to 50 nanometers.

4. The laser diode of claim 1, wherein one or more intermetallic compounds are present at an interface between the first metal layer and the second metal layer.

5. The laser diode of claim 1, wherein the first metal layer comprises a metal chosen from platinum, palladium, and combinations thereof.

6. The laser diode of claim 1, wherein the first metal layer has a thickness from 10 to 100 nanometers.

7. The laser diode of claim 1, wherein the metal conductive layer comprises a metal chosen from gold, copper, and combinations thereof.

8. The laser diode of claim 1, wherein the metal conductive layer has a thickness from 100 nanometers to 800 nanometers.

9. The laser diode of claim 1, wherein the metal adhesion layer comprises a metal chosen from titanium, titanium, chromium, nickel, tantalum, and combinations thereof.

10. The laser diode of claim 1, wherein metal adhesion layer has a thickness from 0.5 nanometers to 10 nanometers.

11. The laser diode of claim 1, further comprising one or more metal layers disposed on the metal conductive layer.

12. The laser diode of claim 11, wherein the one or more metal layers comprise a metal layer having a thickness from 5 to 50 nanometers.

13. A substrate comprising a plurality of laser diodes of claim 1.

14. An apparatus comprising:
a substrate;
a laser diode of claim 1, wherein the laser diode is encapsulated by dielectric material on the substrate; and
a near-field transducer located on the substrate and optically coupled to the laser diode to receive light from the laser diode.

15. The apparatus of claim 14, wherein the apparatus is a heat-assisted magnetic recording read/write head.

16. The apparatus of claim 14, further comprising a waveguide disposed between the laser diode and the near-field transducer.

17. A data storage device comprising the apparatus of claim 14.

18. A computing system comprising a plurality of data storage devices of claim 17.

19. A method comprising:
transfer printing the plurality of laser diodes on the substrate of claim 13 to a mounting surface on a target substrate; and
processing the plurality of laser diodes to integrate each of the plurality of laser diodes into a corresponding read/write head.

20. A method comprising:
forming a multilayer metal structure on a top surface of a p-type region of a semiconductor laser structure, wherein the multilayer metal structure comprises:
  a metal adhesion layer disposed on the p-type region of the semiconductor laser structure;
  a metal bi-layer disposed on the metal adhesion layer, wherein the metal bi-layer comprises:
  a first metal layer disposed on the metal adhesion layer; and
    a second metal layer disposed on the first metal layer, wherein the second metal layer comprises a metal that is different from a metal in the first metal layer, and
  a metal conductive layer disposed on the second metal layer; and
exposing the multilayer metal structure to thermal annealing conditions to form a p-metal electrical contact.

* * * * *